US012757681B2

(12) United States Patent
Usami et al.

(10) Patent No.: US 12,757,681 B2
(45) Date of Patent: Oct. 6, 2026

(54) MEMBER FOR SEMICONDUCTOR MANUFACTURING APPARATUS

(71) Applicant: NGK INSULATORS, LTD., Nagoya-City (JP)

(72) Inventors: Taro Usami, Ginan-town (JP); Tatsuya Kuno, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 121 days.

(21) Appl. No.: 18/651,927

(22) Filed: May 1, 2024

(65) Prior Publication Data

US 2025/0149368 A1 May 8, 2025

Related U.S. Application Data

(63) Continuation of application No. PCT/JP2023/039655, filed on Nov. 2, 2023.

(51) Int. Cl.
*H10P 72/72* (2026.01)

(52) U.S. Cl.
CPC .................................. *H10P 72/722* (2026.01)

(58) Field of Classification Search
CPC ........... H01L 21/6833; H01L 21/67103; H01L 21/67109; H01L 21/6831; H01L 21/68757; H01L 21/68785
USPC ......................................................... 361/234
See application file for complete search history.

(56) References Cited

U.S. PATENT DOCUMENTS

| | | | | |
|---|---|---|---|---|
| 5,800,618 A * | 9/1998 | Niori | H01J 37/32009 118/725 |
| 11,348,819 B2 * | 5/2022 | Kinpara | H10P 72/0432 |
| 12,165,896 B2 * | 12/2024 | Nagayama | H01J 37/32715 |
| 12,300,530 B2 * | 5/2025 | Satake | H01J 37/32715 |

(Continued)

FOREIGN PATENT DOCUMENTS

| | | |
|---|---|---|
| JP | 3182120 U | 3/2013 |
| JP | 7356620 B1 | 10/2023 |

(Continued)

OTHER PUBLICATIONS

International Search Report and Written Opinion (Application No. PCT/JP2023/039655) dated Jan. 23, 2024 (7 pages).

(Continued)

*Primary Examiner* — Dharti H Patel
(74) *Attorney, Agent, or Firm* — Muncy, Geissler, Olds & Lowe, P.C.

(57) ABSTRACT

A member for semiconductor manufacturing apparatus includes: a ceramic plate having a wafer placement surface on its upper surface and a built-in electrode; a base plate provided on a lower surface of the ceramic plate; a base plate through-hole that penetrates the base plate in an up-down direction; an insulating tube inserted into the base plate through-hole; an adhesive agent pool provided in at least one of an inner circumferential surface of the base plate through-hole or an outer circumferential surface of the insulating tube, and disposed at a position down away from an upper surface of the insulating tube; and an adhesive layer including an insulating tube outer circumferential surface adhesion part formed from the lower surface of the ceramic plate to an intermediate point of the adhesive agent pool.

5 Claims, 8 Drawing Sheets

(56) References Cited

U.S. PATENT DOCUMENTS

| | | | | |
|---|---|---|---|---|
| 12,564,013 | B2 * | 2/2026 | Inoue | H10P 72/7616 |
| 2014/0202635 | A1 * | 7/2014 | Yamaguchi | H10P 72/7612 279/128 |
| 2014/0376148 | A1 * | 12/2014 | Sasaki | H10P 72/722 361/234 |
| 2019/0019714 | A1 * | 1/2019 | Kosakai | H10P 72/722 |
| 2020/0090959 | A1 | 3/2020 | Takebayashi | |
| 2020/0343125 | A1 * | 10/2020 | Kinpara | H10P 72/0432 |
| 2021/0043489 | A1 * | 2/2021 | Satake | H01J 37/32715 |
| 2021/0268616 | A1 * | 9/2021 | Sato | B23Q 3/15 |
| 2022/0028719 | A1 | 1/2022 | Takemori | |
| 2023/0115256 | A1 * | 4/2023 | Yamazaki | H10P 72/722 361/234 |
| 2023/0146001 | A1 * | 5/2023 | Kuno | H01J 37/32642 414/271 |
| 2023/0207370 | A1 * | 6/2023 | Inoue | H10P 72/722 257/703 |
| 2023/0223291 | A1 * | 7/2023 | Inoue | H01J 37/32724 279/128 |
| 2024/0055240 | A1 * | 2/2024 | Kojima | H01J 37/32724 |
| 2024/0079218 | A1 * | 3/2024 | Kuno | H01J 37/32724 |
| 2024/0186170 | A1 * | 6/2024 | Hirata | H10P 72/722 |
| 2024/0312769 | A1 * | 9/2024 | Arikawa | H01J 37/32715 |

FOREIGN PATENT DOCUMENTS

| | | | |
|---|---|---|---|
| WO | 2018/230446 | A1 | 12/2018 |
| WO | 2020/111194 | A1 | 6/2020 |

OTHER PUBLICATIONS

English translation of the International Preliminary Report on Patentability (Chapter I) for International Application No. PCT/JP2023/039655 dated May 15, 2026.

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

Conventionally, members for semiconductor manufacturing apparatus have been known which include: a ceramic plate having a wafer placement surface on its upper surface and a built-in electrode; and a base plate provided on the lower surface of the ceramic plate. For example, PTL 1 discloses a member for semiconductor manufacturing apparatus, including: a base plate through-hole that penetrates the base plate in a thickness direction; an insulating tube inserted into the base plate through-hole; and an annular member located between the outer circumferential surface of the insulating tube and the inner circumferential surface of the base plate through-hole. The insulating tube is fixed to the inner circumferential surface of the base plate through-hole by the annular member. A description states that thus, the outer circumferential surface of the insulating tube and the inner circumferential surface of the base plate through-hole are maintained in a non-contact state, and thermal stress generated between both surfaces can be reduced. Note that the insulating tube has, on its outer circumferential surface, a recess to prevent positional deviation of the annular member, and the annular member is fixed to the recess. A description states that a resin member such as a silicone resin may be provided between the outer circumferential surface of the insulating tube and the inner circumferential surface of the base plate through-hole; however, the annular member is fixed to the recess, and no resin member has entered the recess.

CITATION LIST

Patent Literature

PTL 1: International Publication No. 2020/111194

SUMMARY OF THE INVENTION

However, in PTL 1, for example when a resin member is provided between the outer circumferential surface of the insulating tube and the inner circumferential surface of a hole, the length in an up-down direction of the resin member cannot be controlled, and the temperature immediately above the base plate through-hole may vary with product.

The present invention has been devised to solve such a problem, and it is a main object to reduce variation with product in the temperature of an area of the wafer placement surface, the area being immediately above the base plate through-hole.

[1] A member for semiconductor manufacturing apparatus of the present invention includes: a ceramic plate having a wafer placement surface on its upper surface and a built-in electrode; a base plate provided on a lower surface of the ceramic plate; a base plate through-hole that penetrates the base plate in an up-down direction; an insulating tube inserted into the base plate through-hole; an adhesive agent pool provided in at least one of an inner circumferential surface of the base plate through-hole or an outer circumferential surface of the insulating tube, and disposed at a position down away from an upper surface of the insulating tube; and an adhesive layer including an insulating tube outer circumferential surface adhesion part formed from the lower surface of the ceramic plate to an intermediate point of the adhesive agent pool, and configured to bond the inner circumferential surface of the base plate through-hole and the outer circumferential surface of the insulating tube together.

In the member for semiconductor manufacturing apparatus, at least one of the inner circumferential surface of the base plate through-hole or the outer circumferential surface of the insulating tube is provided with an adhesive agent pool, and the insulating tube outer circumferential surface adhesion part is formed from the lower surface of the ceramic plate to an intermediate point of the adhesive agent pool. Thus, the insulating tube outer circumferential surface adhesion part enters the adhesive agent pool, and spreads in a direction substantially perpendicular to an up-down direction, thus the length in an up-down direction of the insulating tube outer circumferential surface adhesion part is easily controlled. When the length in an up-down direction of the insulating tube outer circumferential surface adhesion part varies with product, of the wafer placement surface, in the area immediately above the base plate through-hole, the temperature may vary with product, but herein, the length in an up-down direction of the insulating tube outer circumferential surface adhesion part is controlled, thus such a variation can be reduced. Note that the adhesive agent pool may be disposed at a position down away from the upper surface of the insulating tube.

In the present description, "upper", "lower" do not represent absolute positional relationship, but represent relative positional relationship. Thus, depending on the orientation of the member for semiconductor manufacturing apparatus, "upper" and "lower" may indicate "lower" and "upper", "left" and "right", or "front" and "back".

[2] In the member for semiconductor manufacturing apparatus (the member for semiconductor manufacturing apparatus according to [1]) of the present invention, the adhesive layer may include an insulating tube upper surface adhesion part continuous to the insulating tube outer circumferential surface adhesion part, and configured to bond the lower surface of the ceramic plate and the upper surface of the insulating tube together. In this setting, not only the space between the inner circumferential surface of the base plate through-hole and the outer circumferential surface of the insulating tube, but also the space between the lower surface of the ceramic plate and the upper surface of the insulating tube can be firmly bonded.

[3] In the member for semiconductor manufacturing apparatus (the member for semiconductor manufacturing apparatus according to [1] or [2]) of the present invention, when a position in an up-down direction of an upper end of the adhesive agent pool is viewed along an outer circumference of the insulating tube, the position in the up-down direction may vary stepwise or continuously. In this setting, the temperature in the area immediately above the base plate through-hole can be finely adjusted.

[4] In the member for semiconductor manufacturing apparatus (the member for semiconductor manufacturing apparatus according to [3]) of the present invention, the base plate may include built-in refrigerant flow paths, and the base plate through-hole is provided between adjacent ones of the refrigerant flow paths, and one of the adjacent refrigerant flow paths has a higher ceiling surface than the other. In this case, heat is more likely to be removed from the ceramic plate by one of the adjacent refrigerant flow paths, having a higher ceiling surface than by the other having a lower ceiling surface, thus the temperature of the wafer placement surface gradually decreases from a position opposed to the refrigerant flow path having a higher ceiling surface toward a position opposed the refrigerant flow path having a lower ceiling surface. However, of the wafer placement surface, the area immediately above the base plate through-hole may have a different tendency of heat removal than the other area, and may become a temperature singular point. Thus, the length in an up-down direction of the insulating tube outer circumferential surface adhesion part may be adjusted by adjusting the position in an up-down direction of the upper end of the adhesive agent pool so that the wafer placement surface including the area immediately above the base plate through-hole has a desired temperature distribution.

For example, the adhesive agent pool may have the highest upper end at the position closest to the refrigerant flow path having a higher ceiling surface, and have the lowest upper end at the position closest to the refrigerant flow path having a lower ceiling surface. In this setting, of the wafer placement surface, in the area immediately above the base plate through-hole, the thermal uniformity can be improved by cancelling the temperature difference due to the difference in height of ceiling surface. Alternatively, for example, the adhesive agent pool may have the lowest upper end at the position closest to the refrigerant flow path having a higher ceiling surface, and have the highest upper end at the position closest to the refrigerant flow path having a lower ceiling surface. In this setting, of the wafer placement surface, the area immediately above the base plate through-hole can have a temperature difference having the same tendency as the temperature difference due to the difference in height of ceiling surface.

[5] In the member for semiconductor manufacturing apparatus (the member for semiconductor manufacturing apparatus according to any one of [1] to [4]) of the present invention, the base plate through-hole may be part of a power supply member insertion hole into which a power supply member to provide electric power to the electrode is inserted, the power supply member being provided downward from the electrode in the member for semiconductor manufacturing apparatus, or part of a lift pin hole that penetrates the member for semiconductor manufacturing apparatus in an up-down direction, and into which a lift pin is inserted, or part of a gas hole that penetrates the member for semiconductor manufacturing apparatus in an up-down direction to supply gas to the wafer placement surface.

DETAILED DESCRIPTION OF THE INVENTION

First Embodiment

Figure 1:
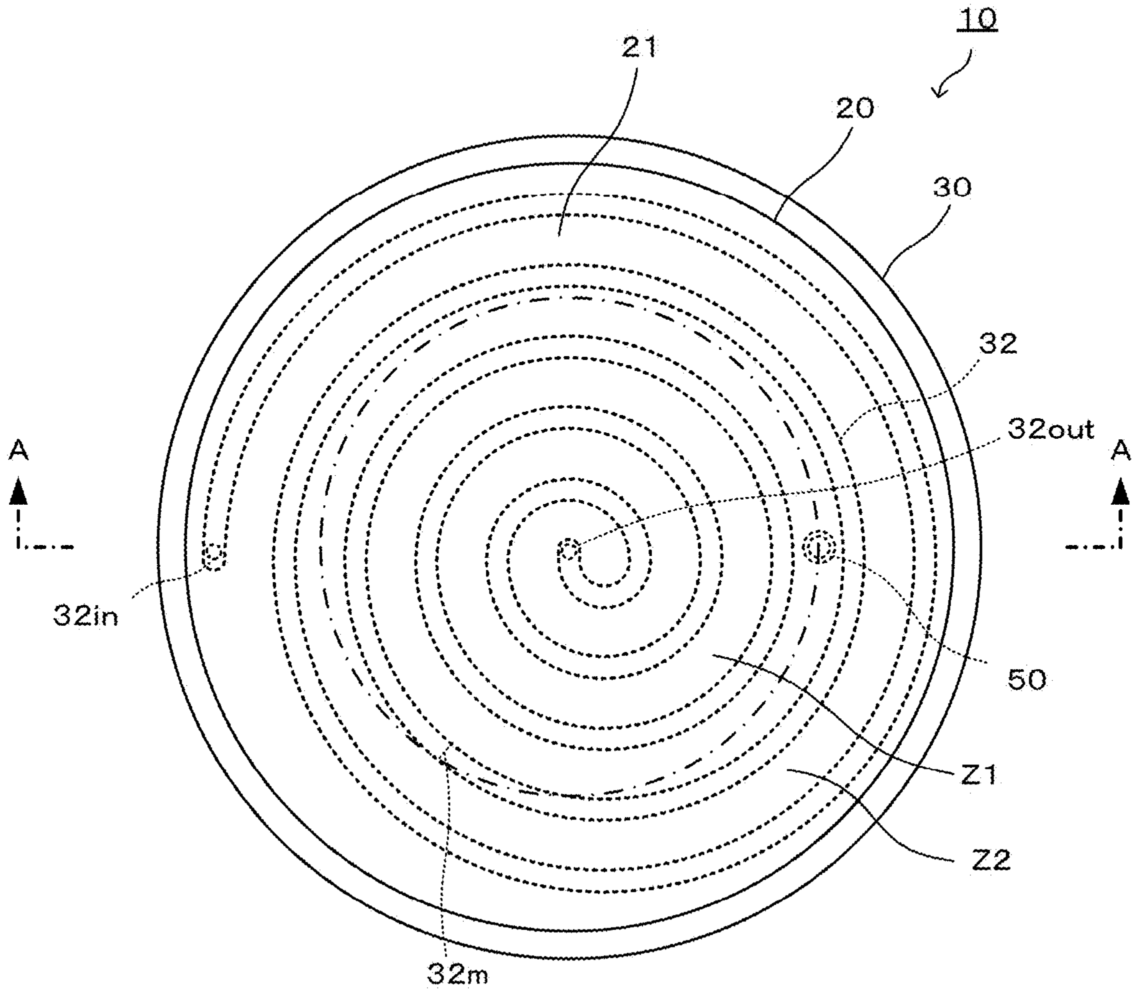
FIG. 1 is a plan view of a wafer placement table 10.
Figure 3:
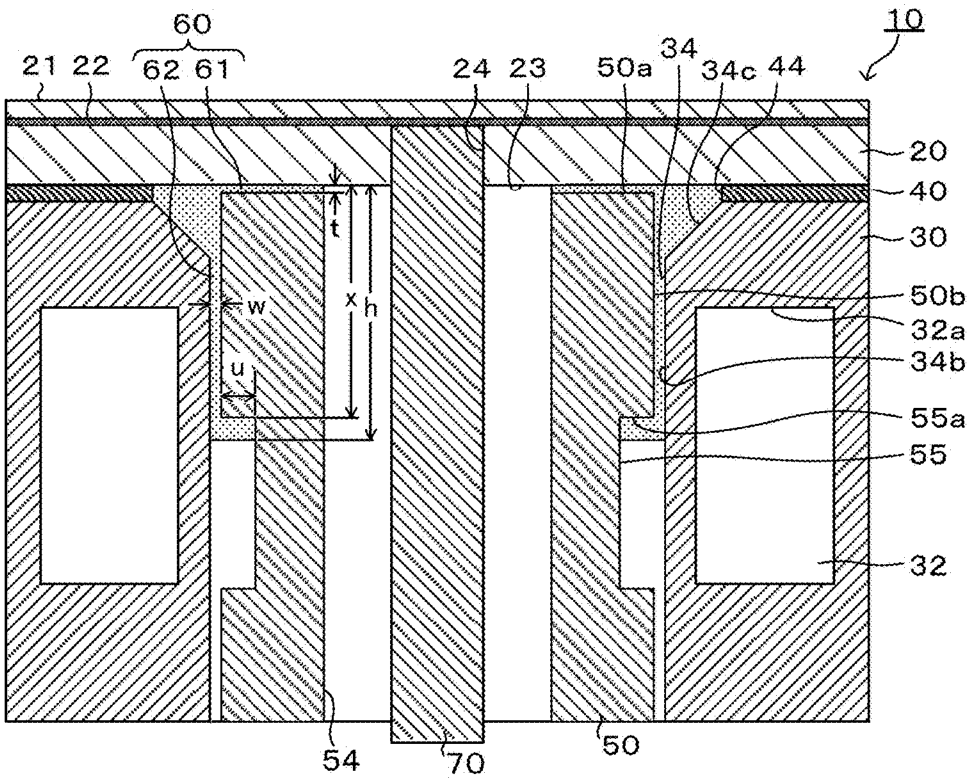
FIG. 3 is a partially enlarged view of FIG. 2.
Figure 4:
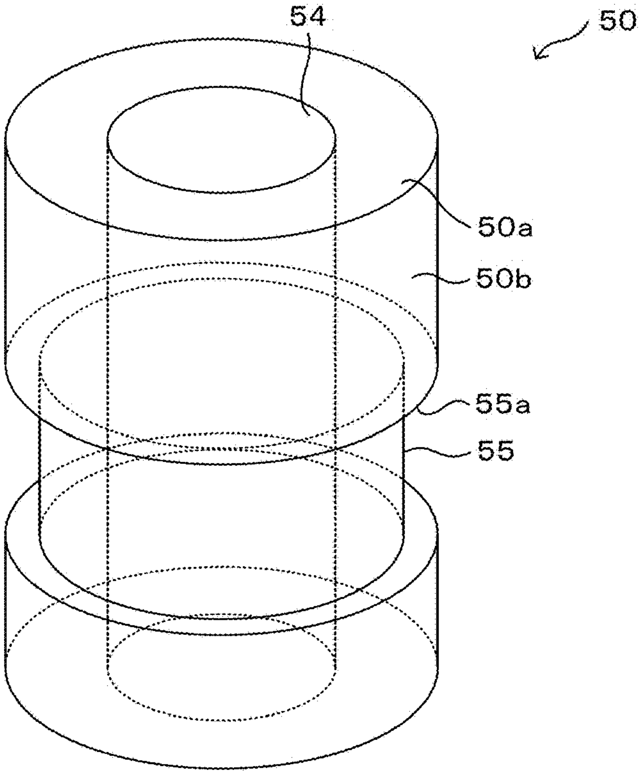
FIG. 4 is a perspective view of an insulating tube 50.

A preferred embodiment of the present invention will be described using the drawings. FIG. 1 is a plan view of a wafer placement table 10, FIG. 2 is an A-A cross-sectional view of FIG. 1, FIG. 3 is a partially enlarged view (an enlarged view in the frame indicated by a two-dot chain line) of FIG. 2, and FIG. 4 is a perspective view of an insulating tube 50.

Figure 2:
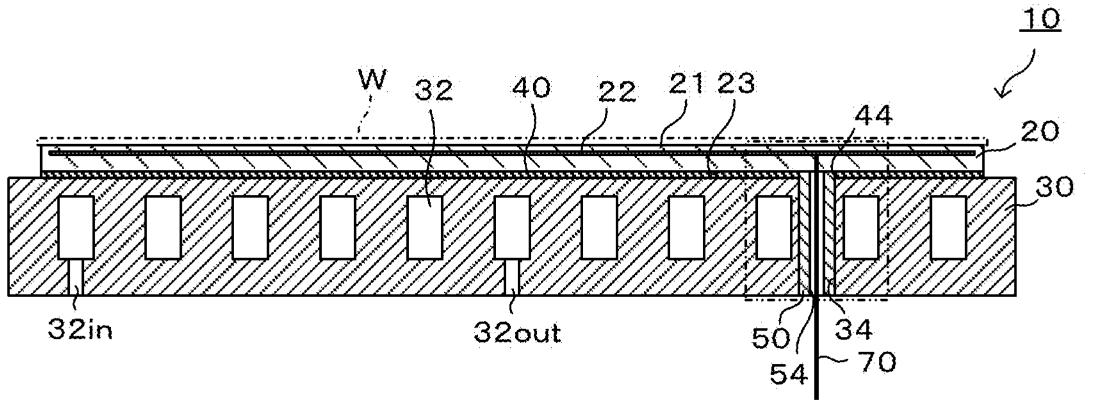
FIG. 2 is an A-A cross-sectional view of FIG. 1.

The wafer placement table 10 is an example of a member for semiconductor manufacturing apparatus of the present invention, and as illustrated in FIG. 2, includes a ceramic plate 20, a base plate 30, a bonding layer 40, a base plate through-hole 34, an insulating tube 50, and a power supply member 70.

The ceramic plate 20 is a ceramic disk (e.g., a diameter of 300 mm, a thickness of 5 mm) such as an alumina sintered body or an aluminum nitride sintered body. The upper surface of the ceramic plate 20 is a wafer placement surface 21 on which wafer W is placed. The ceramic plate 20 has a built-in electrostatic electrode 22. Although illustration is omitted, an annular seal band is formed along the outer edge of the wafer placement surface 21 of the ceramic plate 20, and a plurality of small circular projections are formed on the entire inner region of the seal band. The electrostatic electrode 22 is a planar mesh electrode, and coupled to an external DC power supply (not illustrated) via a power supply member 70. When a DC voltage is applied to the electrostatic electrode 22, the wafer W is attracted and fixed to the wafer placement surface 21 by an electrostatic attraction force, and when the application of the DC voltage is stopped, the attraction and fixing of the wafer W to the wafer placement surface 21 is released.

The base plate 30 is a circular plate (e.g., a circular plate with a thickness of 25 mm and a diameter equal to or greater than the diameter of the ceramic plate 20) having good electrical conductivity and thermal conductivity. A refrigerant flow path 32, through which a refrigerant is circulated, is formed inside the base plate 30. The refrigerant which flows through the refrigerant flow path 32 is preferably liquid, and preferably has electrical insulating properties. As the liquid having electrical insulating properties, e.g., fluorine-based inert liquid may be mentioned. As illustrated in FIG. 1, the refrigerant flow path 32 is formed in a swirl shape over the entirety of the base plate 30 in a one-stroke pattern in a plan view from one end (inlet 32*in*) to the other end (outlet 32*out*). The inlet 32 in and the outlet 32*out* of the refrigerant flow path 32 are respectively coupled to a supply port and a collection port of an external refrigerant device which is not illustrated. The refrigerant supplied from the supply port of the external refrigerant device to the inlet 32 in of the refrigerant flow path 32 passes through the refrigerant flow path 32, then returns from the outlet 32*out* of the refrigerant flow path 32 to the collection port of the refrigerant flow path 32, undergoes temperature control, and is supplied again from the supply port to the inlet 32 in of the refrigerant flow path 32. The base plate 30 is coupled to a radio-frequency (RF) power supply, and is also used as an RF electrode.

As the material for the base plate 30, e.g., a metal material and a composite material of metal and ceramic may be mentioned. As the metal material, Al, Ti, Mo or an alloy thereof may be mentioned. As the composite material of metal and ceramic, a metal matrix composite material (MMC) and a ceramic matrix composite material (CMC) may be mentioned. As a specific example of such a composite material, a material containing Si, SiC and Ti (also referred to as SisiCTi), a material obtained by impregnating a Sic porous body with Al and/or Si, and a composite material of $Al_2O_3$ and TiC may be mentioned. As the material for the base plate 30, a material having a coefficient of thermal expansion closer to that of the material for the ceramic plate 20 is preferably selected. When the material for the ceramic plate 20 is alumina, the material for the base plate 30 is preferably pure Ti or α-β Ti alloy. This is because the coefficient of thermal expansion of pure Ti and α-β Ti alloy is close to the coefficient of thermal expansion of alumina. The base plate 30 may be comprised of a material having a thermal conductivity lower than the thermal conductivity of Al, and may be comprised of a material having a thermal conductivity lower than the thermal conductivity of the material (e.g., alumina) for the ceramic plate 20. As those materials, a Ti-containing material represented by e.g., pure Ti and α-β Ti may be mentioned. When the material for the base plate 30 is a Ti-containing material, the present invention is highly effective. The thermal conductivity of the base plate 30 may be 50 W/mK or lower, and may be 5 to 20 W/mK. For example, the thermal conductivity of pure Ti is 17 W/mK, and the thermal conductivity of α-β Ti is 7.5 W/mK. Note that the thermal conductivity of Al is 150 to 200 W/mK.

The bonding layer 40 is a resin adhesive layer herein, and bonds the lower surface 23 of the ceramic plate 20 and the upper surface of the base plate 30 together. As the material for the resin adhesive layer, e.g., an insulating resin such as an epoxy resin, an acrylic resin, and a silicone resin may be mentioned. The bonding layer 40 may be an insulating resin containing a filler. The filler is preferably a material with a thermal conductivity higher than the thermal conductivity of the insulating resin of the bonding layer 40, and may be e.g., alumina or aluminum nitride.

The base plate through-hole 34 is a substantially cylindrical hole that penetrates the base plate 30 in an up-down direction, and is provided so as not to penetrate the refrigerant flow paths 32. The base plate through-hole 34 communicates with a bonding layer through-hole 44. The bonding layer through-hole 44 is a substantially cylindrical hole that penetrates the bonding layer 40 in an up-down direction.

The insulating tube 50 is stored in the base plate through-hole 34 and the bonding layer through-hole 44. The insulating tube 50 is a substantially cylindrical member comprised of an electrically insulating material (for example, the same material as that of the ceramic plate 20), and has an insulating tube through-hole 54 that penetrates the insulating tube 50 in an up-down direction along the central axis of the insulating tube 50.

As illustrated in FIG. 3, the insulating tube 50 is bonded to the lower surface 23 of the ceramic plate 20 and the inner circumferential surface 34*b* of the base plate through-hole 34 via an adhesive layer 60. The upper end of the base plate through-hole 34 is a tapered surface 34*c* which has a C chamfered shape. The adhesive layer 60 includes: an insulating tube upper surface adhesion part 61 that bonds the lower surface 23 of the ceramic plate 20 and an upper surface 50*a* of the insulating tube 50 together; and an insulating tube outer circumferential surface adhesion part 62 that bonds the inner circumferential surface 34*b* of the base plate through-hole 34 and an outer circumferential surface 50*b* of the insulating tube 50 together. As the material for the adhesive layer 60, e.g., an insulating resin such as an epoxy resin, an acrylic resin, and a silicone resin may be mentioned. The adhesive layer 60 may be an insulating resin which contains a filler. The filler is preferably a material with a thermal conductivity higher than the thermal conductivity of the insulating resin of the adhesive layer 60, and may be e.g., alumina or aluminum nitride. The adhesive layer 60 may have a thermal conductivity higher than the thermal conductivity of the bonding layer 40.

As illustrated in FIGS. 3 and 4, the outer circumferential surface 50*b* of the insulating tube 50 is provided with an adhesive agent pool 55 at the position down away from the lower surface 23 of the ceramic plate 20 by distance x. The adhesive agent pool 55 is an annular U-shaped groove going around the outer circumference of the insulating tube 50 once, and is open to the outer circumferential surface 50*b* of the insulating tube 50. A depth (length in a radial direction) u of the adhesive agent pool 55 is, for example, greater than or equal to 0.1 mm and less than or equal to 0.5 mm. The depth u of the adhesive agent pool 55 may be greater than or equal to twice the distance (length in a radial direction) w between the inner circumferential surface 34*b* (excluding the tapered surface 34*c*) of the base plate through-hole 34 above the adhesive agent pool 55 and the outer circumferential surface 50*b* of the insulating tube 50. The position of upper end (upper wall surface) 55*a* of the adhesive agent pool 55 is preferably lower than the ceiling surface 32*a* of the refrigerant flow path 32. The inner circumferential surface 34*b* (including the tapered surface 34*c*) of the base plate through-hole 34 and the outer circumferential surface 50*b* of the insulating tube 50 are bonded by the insulating tube outer circumferential surface adhesion part 62 of the adhesive layer 60. The insulating tube outer circumferential surface adhesion part 62 is formed from the lower surface 23 of the ceramic plate 20 to an intermediate point (herein, the position down away from the lower surface 23 of the ceramic plate 20 by distance h) of the adhesive agent pool 55. Note that the distance (length in an up-down direction) between the lower surface 23 of the ceramic plate 20 and the lower end of the insulating tube outer circumferential surface adhesion part 62 is also referred to as the amount of creep h of the insulating tube outer circumferential surface adhesion part 62. Note that for a greater amount of creep h, the temperature immediately above the base plate through-hole is likely to be relatively lower than the temperature in the other part. The value of h-x, which is the length of a portion of the insulating tube outer circumferential surface adhesion part 62, the portion being formed in the adhesive agent pool 55, is preferably less than or equal to 0.5 mm. It is sufficient that the value of h-x exceed 0 mm. The insulating tube upper surface adhesion part 61 is provided continuously to the insulating tube outer circumferential surface adhesion part 62. The thickness t of the insulating tube upper surface adhesion part 61 is, for example, greater than or equal to 0.05 mm and less than or equal to 0.2 mm.

The power supply member 70 is e.g., a metal rod. The metal used for the power supply member 70 is e.g., W, Mo, Ni, and preferably has a coefficient of thermal expansion close to the coefficient of thermal expansion of the ceramic plate 20. As illustrated in FIG. 3, the power supply member 70 is inserted into the insulating tube through-hole 54 and a ceramic plate bottomed hole 24, and electrically connected to the electrostatic electrode 22 exposed to the ceramic plate bottomed hole 24 to supply electric power to the electrostatic electrode 22. The ceramic plate bottomed hole 24 is a substantially cylindrical hole provided from the lower surface 23 of the ceramic plate 20 to the electrostatic electrode 22, and is smaller than the insulating tube through-hole 54 in diameter. The power supply member 70 is electrically insulated from the base plate 30 by the insulating tube 50 disposed in the base plate through-hole 34 and the bonding layer through-hole 44. Instead of being comprised of one metal rod, the power supply member 70 may be a flexible metal wire that connects a cylindrical upper metal terminal and a cylindrical lower metal terminal. Note that the base plate through-hole 34, the bonding layer through-hole 44 and the ceramic plate bottomed hole 24 each correspond to a power supply member insertion hole of the present invention.

Subsequently, the process of bonding the insulating tube 50 in a method of manufacturing the wafer placement table 10 will be described using FIGS. 5A to 5D. FIGS. 5A to 5D are explanatory views of the process. Note that in FIGS. 5A to 5D, the wafer placement surface 21 of the ceramic plate 20 faces down. FIGS. 5A to 5D are partially enlarged views of the surroundings of the base plate through-hole 34.

Figure 5A:
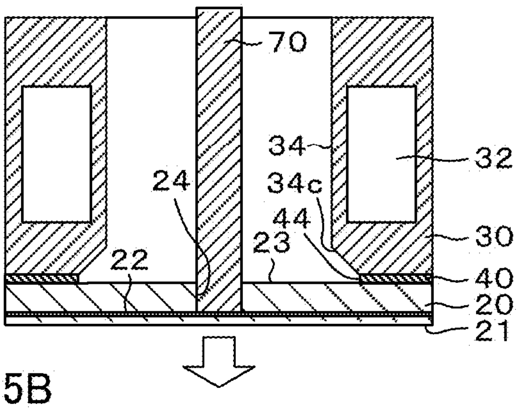
FIGS. 5A to 5D are explanatory views of a bonding process for the insulating tube 50.
Figure 5B:
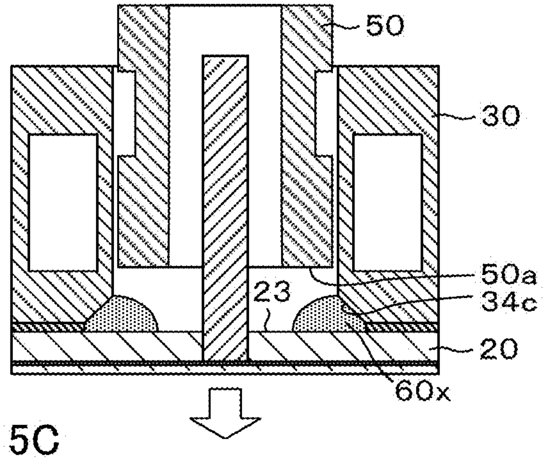
Figure 5C:
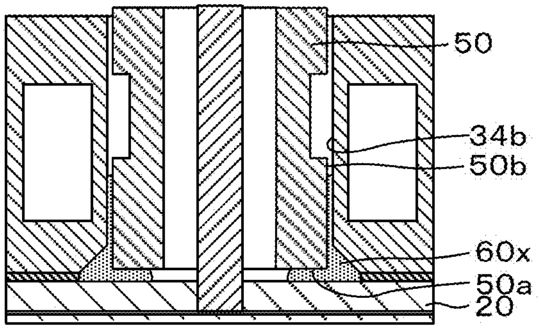
Figure 5D:
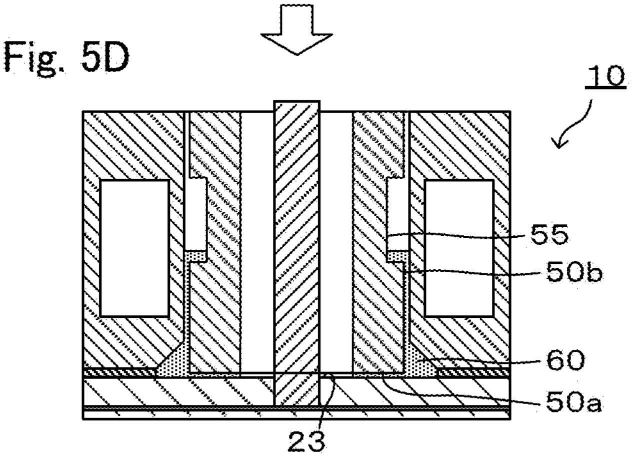

First, a bonded body obtained by bonding the ceramic plate 20 and the base plate 30 by the bonding layer 40 is prepared (FIG. 5A). In the bonded body, the electrostatic electrode 22 is embedded in the ceramic plate 20. In the bonded body, the power supply member 70 is inserted into the ceramic plate bottomed hole 24 through the base plate through-hole 34 and the bonding layer through-hole 44, and is electrically connected to the electrostatic electrode 22. Next, an adhesive agent 60*x* is disposed between the tapered surface 34*c* of the base plate through-hole 34 and the lower surface 23 of the ceramic plate 20, and the insulating tube 50 is inserted into the base plate through-hole 34 so that the upper surface 50*a* of the insulating tube 50 is opposed to the adhesive agent 60*x* (FIG. 5B). Subsequently, when the insulating tube 50 is inserted toward the ceramic plate 20, the adhesive agent 60*x* adheres and spreads between the lower surface 23 of the ceramic plate 20 and the upper surface 50*a* of the insulating tube 50, and between the inner circumferential surface 34*b* of the base plate through-hole 34 and the outer circumferential surface 50*b* of the insulating tube 50 (FIG. 5C). Furthermore, when the insulating tube 50 is inserted toward the ceramic plate 20, the adhesive agent 60*x* is filled between the lower surface 23 of the ceramic plate 20 and the upper surface 50*a* of the insulating tube 50, and is raised up between the inner circumferential surface 34*b* of the base plate through-hole 34 and the outer circumferential surface 50*b* of the insulating tube 50, and formed to an intermediate point of the adhesive agent pool 55. The amount of the adhesive agent 60*x* is pre-set so as to slightly exceed the upper end 55*a* of the adhesive agent pool 55. When the adhesive agent 60*x* is hardened in this state, the ceramic plate 20 and the base plate 30, and the insulating tube 50 are bonded via the adhesive layer 60. In this manner, the wafer placement table 10 is obtained (FIG. 5D).

Next, a use example of thus configured wafer placement table 10 will be described. First, in a state where the wafer placement table 10 is installed in a chamber (not illustrated), the wafer W is placed on the wafer placement surface 21. The inside of the chamber is decompressed by a vacuum pump, and adjusted to a predetermined degree of vacuum, and a DC voltage is applied to the electrostatic electrode 22 of the ceramic plate 20 to generate an electrostatic attraction force to cause the wafer W to be attracted and fixed to the wafer placement surface 21. Next, a reactive gas atmosphere having a predetermined pressure (e.g., several 10 to several 100 Pa) is attained in the chamber, and in this state, an RF voltage is applied across an upper electrode (not illustrated) provided in the ceiling portion in the chamber and the base plate 30 of the wafer placement table 10 to generate a plasma. The surface of wafer W is processed by the generated plasma. A refrigerant is circulated through the refrigerant flow path 32 of the base plate 30 as appropriate.

Figure 6A:
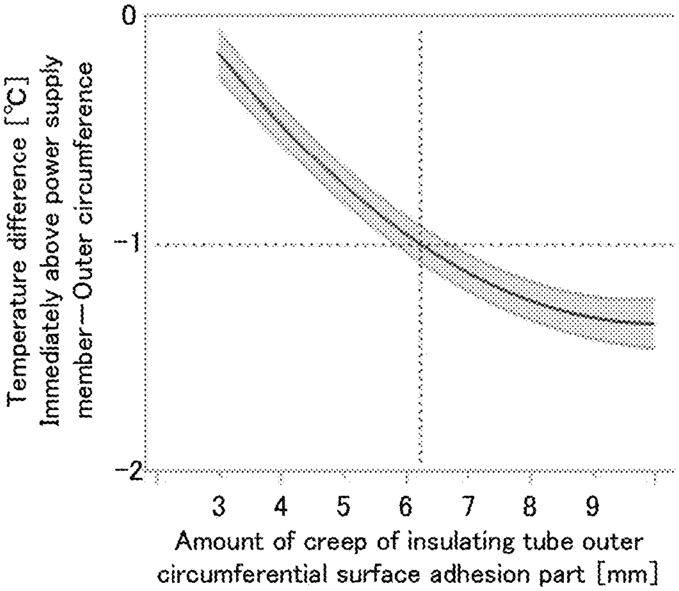
FIGS. 6A and 6B are explanatory views of the result of analysis of the relationship between the amount of creep of the insulating tube outer circumferential surface adhesion part, and the temperature difference obtained by subtracting the outer circumferential temperature from the temperature immediately above the power supply member.
Figure 6B:
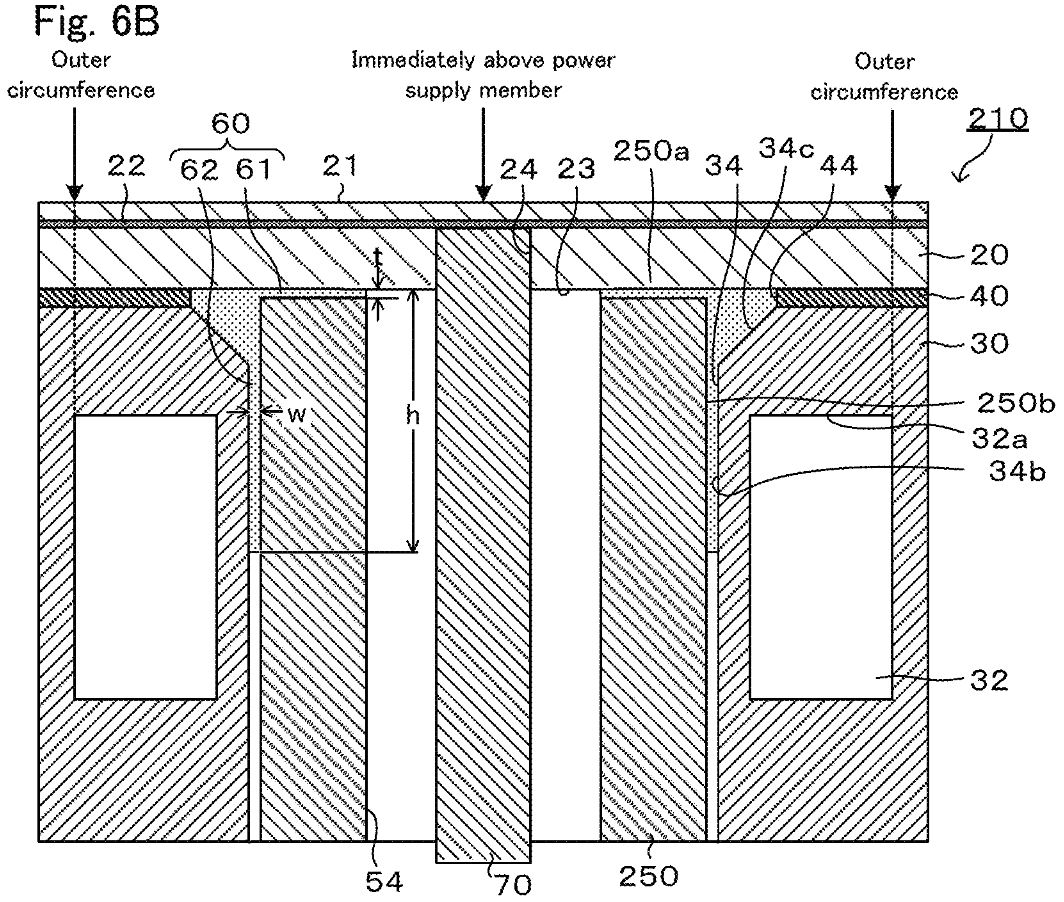

When the wafer W is processed by plasma in this manner, heat input by the plasma is removed by the base plate 30, and the wafer placement surface 21 is controlled at a desired temperature. However, if the amount of creep h of the insulating tube outer circumferential surface adhesion part 62 cannot be controlled, the temperature in the area immediately above the base plate through-hole may vary with product. This point will be described using FIGS. 6A and 6B. FIG. 6A is a graph showing the relationship between the amount of creep h of the insulating tube outer circumferential surface adhesion part 62, and the temperature difference obtained by subtracting the outer circumferential temperature from the temperature immediately above the power supply member. FIG. 6B is a partially enlarged view of a wafer placement table 210 used for analysis. The measurement points for the temperature immediately above the power supply member and the outer circumferential temperature are as shown in FIG. 6B. The cross section shown in FIG. 6B corresponds to the cross section shown in FIG. 3. Note that in FIG. 6B, the same components as in the wafer placement table 10 are labeled with the same symbol. The wafer placement table 210 is the same as the wafer placement table 10 except that an insulating tube 250 having no adhesive agent pool is used instead of the insulating tube 50 for an outer circumferential surface 250*b*. As the material for the wafer placement table 210, alumina (with a thermal conductivity of 30 W/mK) for the ceramic plate 20, Ti (with a thermal conductivity of 17.5 W/mK) for the base plate 30, silicone resin (with a thermal conductivity of 0.2 W/mK) for the bonding layer 40, alumina (with a thermal conductivity of 30 W/mK) for the insulating tube 250, an alumina filler-containing silicone resin (with a thermal conductivity of 2.2 W/mK) for the adhesive layer 60, and Mo (with a thermal conductivity of 138 W/mK) and Cu (with a thermal conductivity of 398 W/mK) for the power supply member 70 are used. It is assumed that the space (including the adhesive agent pool 55) inside the base plate through-hole 34 is filled with the atmosphere (with a thermal conductivity of 0.024 W/mK). Note that in this analysis, the thickness t of the insulating tube upper surface adhesion part 61 and the distance w are assumed to be fixed values, 0.025 mm and 0.3 mm. The distance between the lower surface 23 of the ceramic plate 20 and the ceiling surface 32*a* of the refrigerant flow path 32 is assumed to be a fixed value less than 3 mm. As a result of the analysis, as illustrated in FIG. 6A, when the amount of creep h of the insulating tube outer circumferential surface adhesion part 62 increases from 3 mm to 10 mm, the temperature difference changed from approximately 0° C. to approximately −1.3° C. At this point, the outer circumference (see FIG. 6B) cooled by a refrigerant has a substantially constant temperature regardless of the amount of creep h of the insulating tube outer circumferential surface adhesion part 62, and in the area immediately above the base plate through-hole 34, such as the area (see FIG. 6B) immediately above the power supply member, the temperature changed according to the amount of creep of the insulating tube outer circumferential surface adhesion part 62. Based on the above, it was found that for a greater amount of the creep h, heat is relatively more likely to be removed from the area immediately above the base plate through-hole than the other part (e.g., the outer circumference of FIG. 6B), thus the temperature of the area is likely to be reduced. Therefore, if the amount of creep h of the insulating tube outer circumferential surface adhesion part 62 cannot be controlled, the temperature in the area immediately above the base plate through-hole 34 varies with product. In contrast, in the wafer placement table 10, adhesive agent enters the adhesive agent pool 55, and spreads in a direction substantially perpendicular to an up-down direction, thus further creep is prevented, and the amount of creep of the insulating tube outer circumferential surface adhesion part 62 can be controlled, and therefore such a variation can be reduced.

In the wafer placement table 10 described in detail above, the outer circumferential surface 50*b* of the insulating tube 50 has the adhesive agent pool 55, thus the amount of creep of the insulating tube outer circumferential surface adhesion part 62 can be controlled. Thus, of the wafer placement surface 21, in the area immediately above the base plate through-hole 34, variation in the temperature with product can be further reduced.

Note that the present invention is not limited to the above-described first embodiment at all, and it is needless to say that the present invention can be carried out in various forms as long as the forms belong to the technical scope of the present invention.

Figure 7:
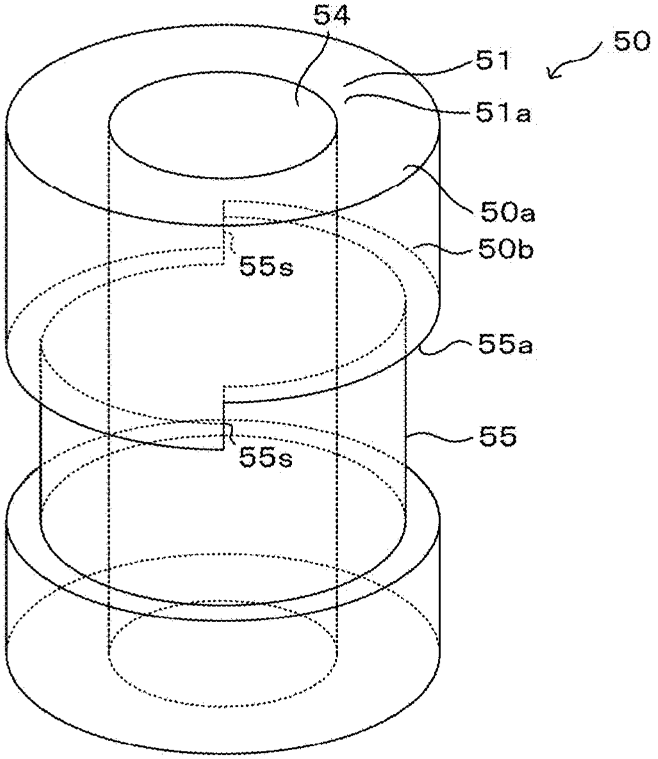
FIG. 7 is a perspective view of another example of the insulating tube 50.
Figure 8:
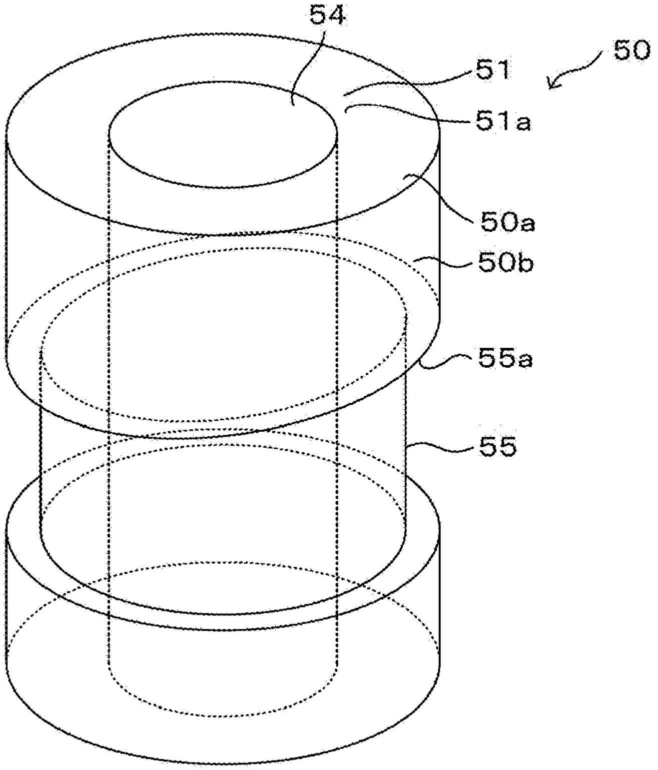
FIG. 8 is a perspective view of another example of the insulating tube 50.

In the first embodiment described above, the position in an up-down direction of the upper end 55*a* of the adhesive agent pool 55 is constant, but may be varied. For a lower position in an up-down direction of the upper end 55*a* of the adhesive agent pool 55, the amount of creep h of the insulating tube outer circumferential surface adhesion part 62 increases, thus heat is relatively more likely to be removed from the area immediately above the base plate through-hole than the other part, thus the temperature of the area is likely to be reduced. Therefore, the temperature of the area immediately above the base plate through-hole 34 can be finely adjusted by changing the position in an up-down direction of the upper end 55*a* of the adhesive agent pool 55 according to desired heat removal distribution and temperature distribution. Specifically, for example, as in FIGS. 7 and 8, when the position in an up-down direction of the upper end 55*a* of the adhesive agent pool 55 is viewed along the outer circumference of the insulating tube 50, the position in the up-down direction may vary stepwise or continuously. In FIG. 7, when the upper end 55*a* of the adhesive agent pool 55 is viewed along the outer circumference of the insulating tube 50, the upper end 55*a* has a step 55*s* at each of two places in total on the near side of the paper surface and the far side of the paper surface, and the right side of the paper surface is assumed to be stepwise higher than the left side of the paper surface with the boundary at the step 55*s*. In this case, when viewed along the outer circumference of the insulating tube 50, the amount of creep h of the insulating tube outer circumferential surface adhesion part 62 is smaller on the right side of the paper surface than on the left side of the paper surface with the boundary at the vicinity of the step 55*s*. In FIG. 8, it is assumed that when the upper end 55*a* of the adhesive agent pool 55 is viewed along the outer circumference of the insulating tube 50, the upper end 55*a* is inclined (continuously varied) so that the right side of the paper surface is higher than the left side of the paper surface. In this case, when viewed along the outer circumference of the insulating tube 50, the amount of creep h of the insulating tube outer circumferential surface adhesion part 62 is smaller on the right side of the paper surface than on the left side of the paper surface according to the slope of the upper end 55*a*. Note that in FIGS. 7 and 8, the same components as in the first embodiment are labeled with the same symbol.

In the first embodiment described above, the adhesive agent pool 55 is a U-shaped groove open to the outer circumferential surface 50*b* of the insulating tube 50, but may be an L-shaped groove which is open not only to the outer circumferential surface 50*b* of the insulating tube 50, but also to the lower surface of the insulating tube 50.

In the first embodiment described above, the power supply member 70 is disposed in the ceramic plate bottomed hole 24 without a gap therebetween; however, the power supply member 70 may be disposed with a gap between itself and the inner circumferential surface of the ceramic plate bottomed hole 24. This point also applies to the second embodiment described below.

In the first embodiment described above, a resin adhesive layer has been illustrated as the bonding layer 40, however, is not limited thereto. For example, a metal bonding layer may be used as the bonding layer 40. The metal bonding layer can be formed by well-known TCB (Thermal compression bonding) using a metal bonding material (e.g., Al—Mg based bonding material or Al—Si—Mg based bonding material). This point also applies to the second embodiment described below.

In the first embodiment described above, the electrostatic electrode 22 is built in the ceramic plate 20, however, is not limited thereto. For example, in substitution for or in addition to the electrostatic electrode 22, a heater electrode (resistance heating element) may be built in or an (RF) electrode for plasma generation may be built in. This point also applies to the second embodiment described below.

Figure 9:
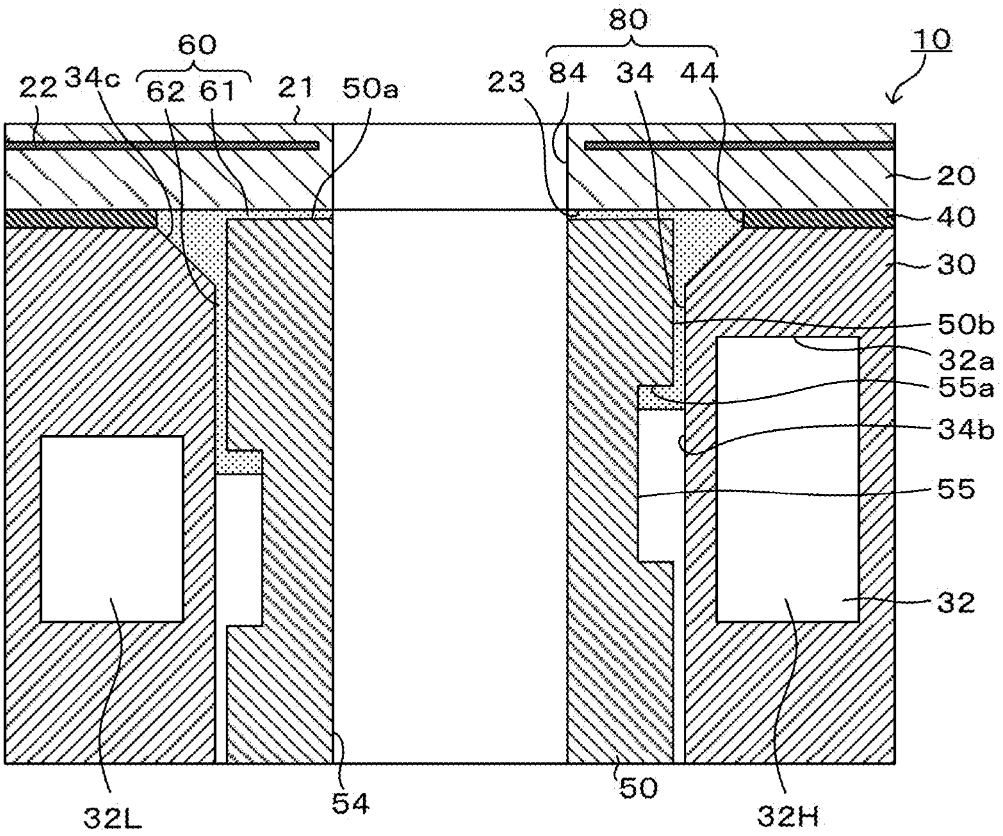
FIG. 9 is a partially enlarged view of another example of the wafer placement table 10.

In the first embodiment described above, the base plate through-hole 34 is configured as the power supply member insertion hole, but is not limited thereto. For example, the base plate through-hole 34 may be configured as a lift pin hole, or configured as a gas hole. The lift pin hole is a hole that penetrates the wafer placement table 10 in an up-down direction for inserting a lift pin to vertically move the wafer W with respect to the wafer placement surface 21. For example, when the wafer W is supported by three lift pins, three lift pin holes are provided. The gas hole is a hole that penetrates the wafer placement table 10 in an up-down direction to supply gas (e.g., He gas) to the wafer placement surface 21. An example in which the base plate through-hole 34 is used as part of the gas hole 80 will be described using FIG. 9. FIG. 9 is a partially enlarged view of another example of the wafer placement table 10. The gas hole 80 is constituted by the base plate through-hole 34, the bonding layer through-hole 44 and a ceramic plate through-hole 84. The ceramic plate through-hole 84 penetrates the ceramic plate 20 and the electrostatic electrode 22 in an up-down direction so as to communicate with the base plate through-hole 34. The electrostatic electrode 22 is not exposed to the inner circumferential surface of the ceramic plate through-hole 84. In FIG. 9, the same components as in the first embodiment described above are labeled with the same symbol. The lift pin hole can be provided in the same manner as for the gas hole 80. This point also applies to the base plate through-hole 134 of the second embodiment described below.

In the first embodiment described above, the base plate through-hole 34 has the tapered surface 34*c*, but may have a straight shape. This point also applies to the base plate through-hole 134 of the second embodiment described below.

In the first embodiment described above, in a central zone Z1 and an outer circumferential zone Z2 having a boundary therebetween indicated by a dash-dot circle in FIG. 1, one zone may be adjusted to have a higher temperature of the wafer placement surface 21 than the other zone, or one zone may be adjusted to have a higher heat removal performance than the other zone. For example, in the central zone Z1 and the outer circumferential zone Z2 illustrated in FIG. 1, the ceiling surface 32*a* of the refrigerant flow path 32 in one zone may be provided at a higher position than that of the other zone. For a higher height (closer to the wafer placement surface 21) of the ceiling surface 32*a* of the refrigerant flow path 32, the temperature of the wafer placement surface 21 is likely to be reduced, thus the heat removal performance is likely to be high. In this situation, as in FIGS. 7 and 8, using the insulating tube 50 with the position in an up-down direction of the upper end 55*a* of the adhesive agent pool 55 varied, the temperature distribution of the wafer placement surface 21 including the area immediately above the base plate through-hole 34 may be adjusted to have a desired temperature distribution. An example will be described using FIG. 9, in which the height of the ceiling surface 32*a* of the refrigerant flow path 32 is varied, and accordingly, the position in an up-down direction of the upper end 55*a* of the adhesive agent pool 55 is varied. In FIG. 9, the refrigerant flow path 32 includes two flow paths 32H, 32L with different heights of the ceiling surface 32*a*. The flow path 32H is the section disposed in the outer circumferential zone Z2, that is, the section from inlet 32 in to a middle position 32*m*, and the flow path 32L is the section disposed in the central zone Z1, that is, the section from the middle position 32*m* to the outlet 32*out* (FIG. 1). The ceiling surface 32*a* in the vicinity of the middle position 32*m* of the refrigerant flow path 32 may be inclined from the flow path 32H to the flow path 32L. The base plate through-hole 34 is provided between adjacent refrigerant flow paths 32. One of the adjacent refrigerant flow paths 32 is the flow path 32H with the ceiling surface 32*a* at a higher position, and the other is the flow path 32L with the ceiling surface 32*a* at a lower position. In the adhesive agent pool 55, the height of the upper end 55*a* is the highest particularly, at the position closest to the flow path 32H in the outer circumferential zone Z2, and the height of the upper end 55*a* is the lowest particularly, at the position closest to the flow path 32L in the central zone Z1. In this manner, of the wafer placement surface 21, in the area immediately above the base plate through-hole 34, the thermal uniformity can be improved by cancelling the temperature difference due to the difference in the height of the ceiling surface 32*a* of the refrigerant flow path 32 by the temperature difference due to the difference in the height of the upper end 55*a* of the adhesive agent pool 55. This point also applies to the second embodiment described below. Note that in the second embodiment, as in FIGS. 12 and 13, the base plate 130 with the position in an up-down direction of the upper end 135*a* of the adhesive agent pool 135 varied may be used.

In the first embodiment described above, the refrigerant flow path 32 is formed in a spiral shape, but the shape of refrigerant flow path 32 is not limited to a specific shape. Alternatively, a plurality of refrigerant flow paths 32 may be provided. This point also applies to the second embodiment described below.

In the first embodiment described above, the adhesive layer 60 includes the insulating tube upper surface adhesion part 61; however, the adhesive layer 60 may not include the insulating tube upper surface adhesion part 61. This point also applies to the second embodiment described below.

Second Embodiment

Figure 10:
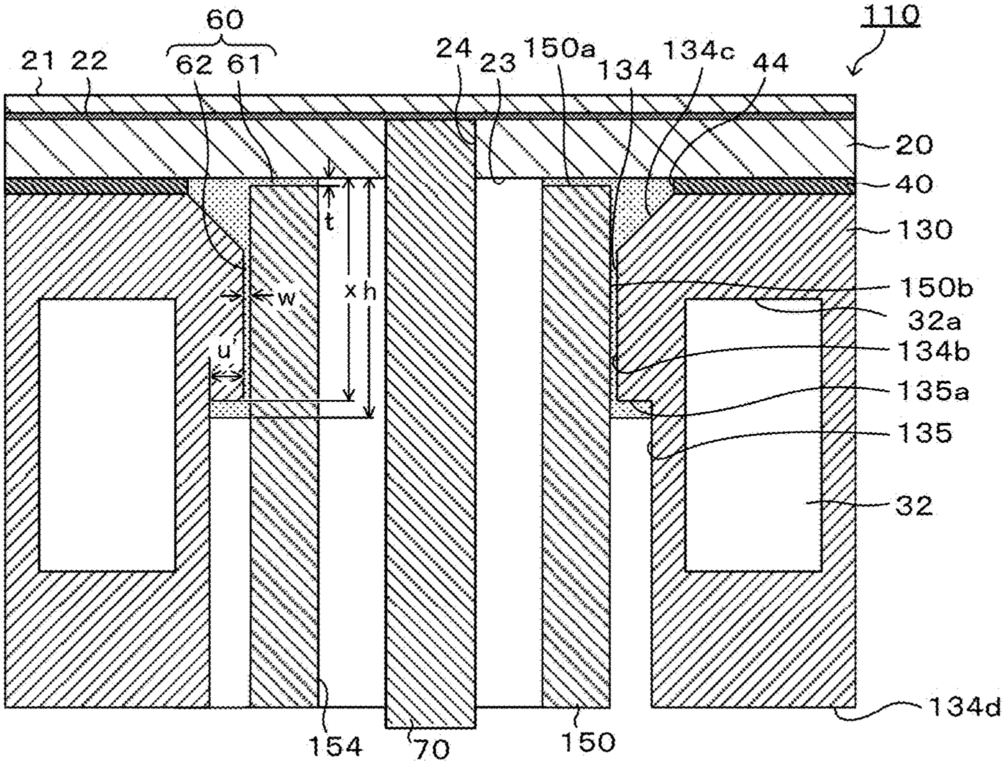
FIG. 10 is a partially enlarged view of a wafer placement table 110.
Figure 11:
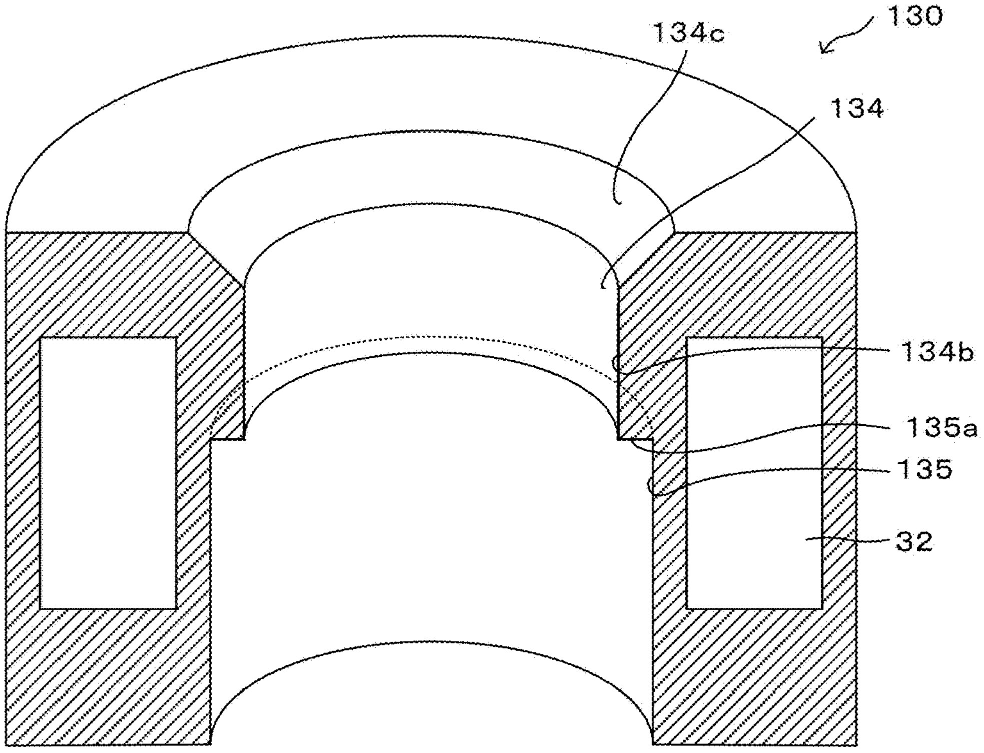
FIG. 11 is an enlarged cross-sectional perspective view of the vicinity of a base plate through-hole 134 of a base plate 130.

A wafer placement table 110 of the second embodiment will be described using the drawings. FIG. 10 is a partially enlarged view (partially enlarged view corresponding to FIG. 3) of the wafer placement table 110, and FIG. 11 is an enlarged cross-sectional perspective view of the vicinity of a base plate through-hole 134 of a base plate 130 (an enlarged cross-sectional perspective view of the vicinity of the base plate through-hole 134 when the base plate 130 is cut by a plane including the central axis of the base plate through-hole 134). Note that in FIG. 10 and FIG. 11, the components of the wafer placement table 110, which are the same as those in the wafer placement table 10 are labeled with the same symbol, and a description thereof is omitted.

The wafer placement table 110 is an example of a member for semiconductor manufacturing apparatus of the present invention, and includes a ceramic plate 20, a base plate 130, a bonding layer 40, a base plate through-hole 134, an insulating tube 150, and a power supply member 70.

The base plate 130 is the same as the base plate 30 except that the shape of the base plate through-hole 134 is different from the shape of the base plate through-hole 34.

The base plate through-hole 134 is a substantially cylindrical hole that penetrates the base plate 130 in an up-down direction, and is provided so as not to penetrate any refrigerant flow path 32. The base plate through-hole 134 communicates with the bonding layer through-hole 44.

The insulating tube 150 is stored in the base plate through-hole 134 and the bonding layer through-hole 44. The insulating tube 150 is a substantially cylindrical member comprised of an electrically insulating material (for example, the same material as that of the ceramic plate 20), and has an insulating tube through-hole 154 that penetrates the insulating tube 150 in an up-down direction along the central axis of the insulating tube 150. The insulating tube 150 is e.g., a cylindrical member with no irregularities on an outer circumferential surface 150*b*.

The insulating tube 150 is bonded to the lower surface 23 of the ceramic plate 20 and the inner circumferential surface 134*b* of the base plate through-hole 134 via the adhesive layer 60. The upper end of the base plate through-hole 134 is a tapered surface 134*c* which has a C chamfered shape. The adhesive layer 60 includes: an insulating tube upper surface adhesion part 61 that bonds the lower surface 23 of the ceramic plate 20 and an upper surface 150*a* of the insulating tube 150 together; and an insulating tube outer circumferential surface adhesion part 62 that bonds the inner circumferential surface 134b of the base plate through-hole 134 and the outer circumferential surface 150b of the insulating tube 150 together.

The inner circumferential surface 134b of the base plate through-hole 134 is provided with an adhesive agent pool 135 at the position down away from the lower surface 23 of the ceramic plate 20 by distance x. The adhesive agent pool 135 is an annular L-shaped groove that goes a circle around the inner circumference of the base plate through-hole 134, and is open to the inner circumferential surface 134b of the base plate through-hole 134 and the lower surface 134d of the base plate 130. A depth (length in a radial direction) u' of the adhesive agent pool 135 is, for example, greater than or equal to 0.1 mm and less than or equal to 0.5 mm. The depth u' of the adhesive agent pool 135 may be greater than or equal to twice the distance (length in a radial direction) w between the inner circumferential surface 134b of the base plate through-hole 134 and the outer circumferential surface 150b of the insulating tube 150. The position of the upper end (upper wall surface) 135a of the adhesive agent pool 135 is preferably lower than the ceiling surface 32a of the refrigerant flow path 32. The inner circumferential surface 134b of the base plate through-hole 134 and the outer circumferential surface 150b of the insulating tube 150 are bonded together by the insulating tube outer circumferential surface adhesion part 62 of the adhesive layer 60. The insulating tube outer circumferential surface adhesion part 62 is formed from the lower surface 23 of the ceramic plate 20 to an intermediate point of the adhesive agent pool 135. Note that the distance (the length in an up-down direction) between the lower surface 23 of the ceramic plate 20 and the lower end of the insulating tube outer circumferential surface adhesion part 62 is also referred to as an amount of creep h of the insulating tube outer circumferential surface adhesion part 62. Note that for a greater amount of creep h, the temperature immediately above the base plate through-hole is likely to be relatively lower than the temperature in the other part. The value of h-x, which is the length of a portion of the insulating tube outer circumferential surface adhesion part 62, the portion being formed in the adhesive agent pool 135, is preferably less than or equal to 0.5 mm. It is sufficient that the value of h−x exceed 0 mm. The insulating tube upper surface adhesion part 61 is provided continuously to the insulating tube outer circumferential surface adhesion part 62. The thickness t of the insulating tube upper surface adhesion part 61 is, for example, greater than or equal to 0.05 mm and less than or equal to 0.2 mm.

As illustrated in FIG. 10, the power supply member 70 is inserted into the insulating tube through-hole 154 and the ceramic plate bottomed hole 24, and electrically connected to the electrostatic electrode 22 exposed to the ceramic plate bottomed hole 24 to supply electric power to the electrostatic electrode 22. The ceramic plate bottomed hole 24 is smaller than the insulating tube through-hole 154 in diameter. The power supply member 70 is electrically insulated from the base plate 130 by the insulating tube 150 disposed in the base plate through-hole 134 and the bonding layer through-hole 44. Note that the base plate through-hole 134, the bonding layer through-hole 44 and the ceramic plate bottomed hole 24 each correspond to a power supply member insertion hole of the present invention.

The manufacturing method for the wafer placement table 10 may serve as the manufacturing method for the wafer placement table 110. In that case, in the description of FIGS. 5A to 5D, the base plate 30 should be replaced by the base plate 130, the base plate through-hole 34 should be replaced by the base plate through-hole 134, the insulating tube 50 should be replaced by the insulating tube 150, the upper surface 50a should be replaced by the upper surface 150a, and the outer circumferential surface 50b should be replaced by the outer circumferential surface 150b.

An example of use of the wafer placement table 10 may serve as an example of use of the wafer placement table 110, thus a description is omitted.

In the wafer placement table 110 described in detail above, the inner circumferential surface 134b of the base plate through-hole 134 has the adhesive agent pool 135 by which the amount of creep of the adhesive layer 60 can be controlled. Thus, of the wafer placement surface 21, in the area immediately above the base plate through-hole 134, variation in the temperature with product can be further reduced.

Note that the present invention is not limited to the above-described second embodiment at all, and it is needless to say that the present invention can be carried out in various forms as long as the forms belong to the technical scope of the present invention.

Figure 12:
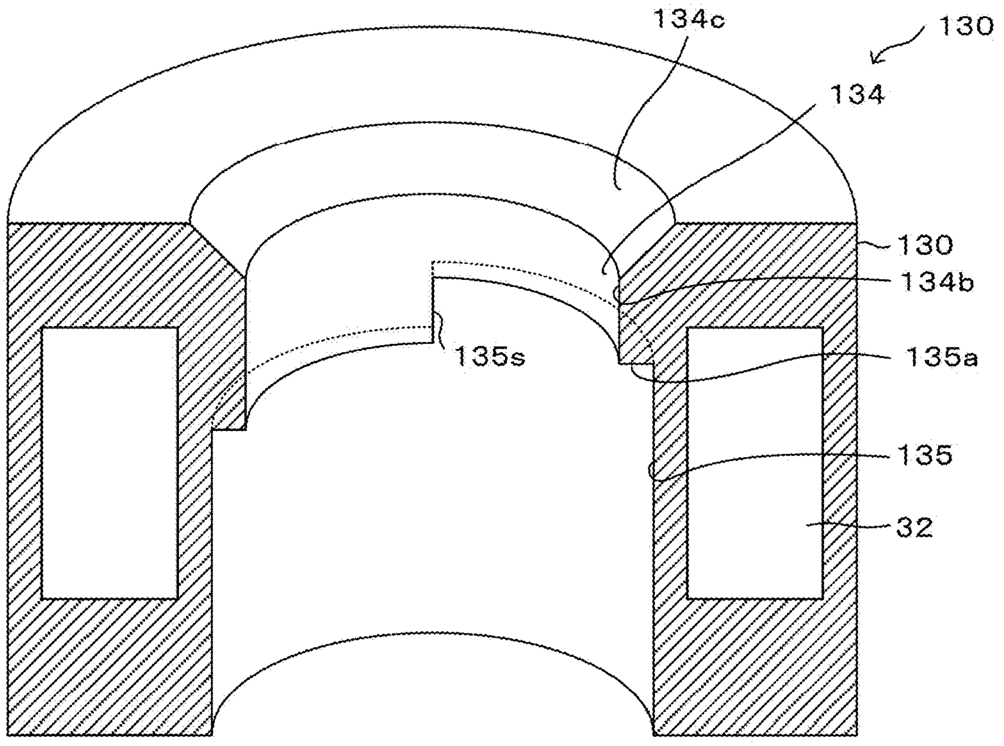
FIG. 12 is an enlarged cross-sectional perspective view of the vicinity of a base plate through-hole 134 of another example of the base plate 130.
Figure 13:
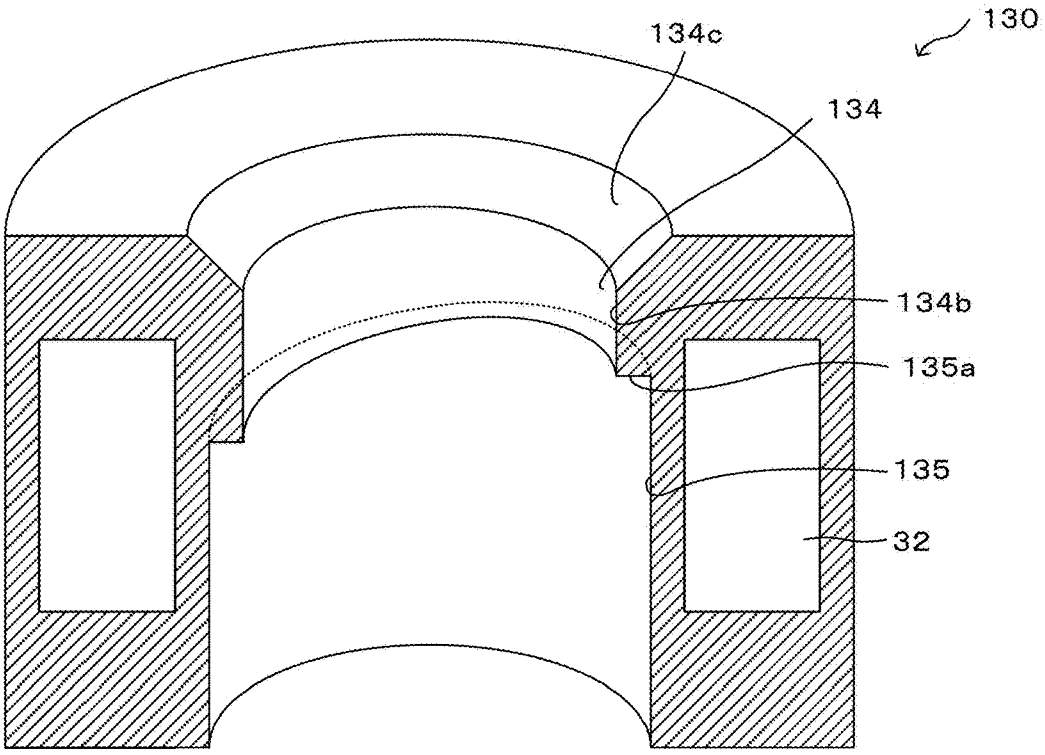
FIG. 13 is an enlarged cross-sectional perspective view of the vicinity of a base plate through-hole 134 of another example of the base plate 130.

In the above-described second embodiment, the position in an up-down direction of the upper end 135a of the adhesive agent pool 135 is constant, but may be varied. For a lower position in an up-down direction of the upper end 135a of the adhesive agent pool 135, the amount of creep h of the insulating tube outer circumferential surface adhesion part 62 increases, thus heat is relatively more likely to be removed from the area immediately above the base plate through-hole than the other part, thus the temperature of the area is likely to be reduced. Therefore, the temperature of the area immediately above the base plate through-hole 34 can be finely adjusted by changing the position in an up-down direction of the upper end 135a of the adhesive agent pool 135 according to desired heat removal distribution and temperature distribution. Specifically, for example, as in FIGS. 12 and 13, when the position in an up-down direction of the upper end 135a of the adhesive agent pool 135 is viewed along the outer circumference of the insulating tube 150, the position in the up-down direction may vary stepwise or continuously. In FIG. 12, when the upper end 135a of the adhesive agent pool 135 is viewed along the outer circumference of the insulating tube 150, the upper end 135a has a step 135s (the step 135s on the near side of the paper surface is not illustrated) at each of two places in total on the near side of the paper surface and the far side of the paper surface, and the right side of the paper surface is assumed to be stepwise higher than the left side of the paper surface with the boundary at the step 135s. In this case, when viewed along the outer circumference of the insulating tube 150, the amount of creep h of the insulating tube outer circumferential surface adhesion part 62 is smaller on the right side of the paper surface than on the left side of the paper surface with the boundary at the vicinity of the step 135s. In FIG. 13, it is assumed that when the upper end 135a of the adhesive agent pool 135 is viewed along the outer circumference of the insulating tube 150, the upper end 135a is inclined (continuously varied) so that the right side of the paper surface is higher than the left side of the paper surface. In this case, when viewed along the outer circumference of the insulating tube 150, the amount of creep h of the insulating tube outer circumferential surface adhesion part 62 is smaller on the right side of the paper surface than on the left side of the paper surface according to the slope of the upper end 135a. Note that in FIGS. 12, 13, the same components as in the first, second embodiments are labeled with the same symbol.

In the above-described second embodiment, the outer circumferential surface 150*b* of the insulating tube 150 may be provided with an adhesive agent pool similar to the adhesive agent pool 55 of the insulating tube 50.

In the above-described second embodiment, the adhesive agent pool 135 is an L-shaped groove open to the inner circumferential surface 134*b* of the base plate through-hole 134 and the lower surface 134*d* of the base plate 130, but may be a U-shaped groove open to the inner circumferential surface 134*b* of the base plate through-hole 134.

International Application No. PCT/JP2023/039655, filed on Nov. 2, 2023, is incorporated herein by reference in its entirety.

What is claimed is:

1. A member for semiconductor manufacturing apparatus, comprising:

a ceramic plate having a wafer placement surface on its upper surface and a built-in electrode;

a base plate provided on a lower surface of the ceramic plate;

a base plate through-hole that penetrates the base plate in an up-down direction;

an insulating tube inserted into the base plate through-hole;

an adhesive agent pool provided in at least one of an inner circumferential surface of the base plate through-hole or an outer circumferential surface of the insulating tube, and disposed at a position down away from an upper surface of the insulating tube; and an adhesive layer including an insulating tube outer circumferential surface adhesion part formed from the lower surface of the ceramic plate to an intermediate point of the adhesive agent pool, and configured to bond the inner circumferential surface of the base plate through-hole and the outer circumferential surface of the insulating tube together.

2. The member for semiconductor manufacturing apparatus according to claim 1, wherein the adhesive layer includes an insulating tube upper surface adhesion part continuous to the insulating tube outer circumferential surface adhesion part, and configured to bond the lower surface of the ceramic plate and the upper surface of the insulating tube together.

3. The member for semiconductor manufacturing apparatus according to claim 1, wherein when a position in an up-down direction of an upper end of the adhesive agent pool is viewed along an outer circumference of the insulating tube, the position in the up-down direction of the upper end of the adhesive agent pool varies stepwise or continuously.

4. The member for semiconductor manufacturing apparatus according to claim 3, wherein the base plate includes built-in refrigerant flow paths, and the base plate through-hole is provided between adjacent ones of the refrigerant flow paths, and one of the adjacent refrigerant flow paths has a higher ceiling surface than the other.

5. The member for semiconductor manufacturing apparatus according to claim 1, wherein the base plate through-hole is part of a power supply member insertion hole into which a power supply member to provide electric power to the electrode is inserted, the power supply member being provided downward from the electrode in the member for semiconductor manufacturing apparatus, or part of a lift pin hole that penetrates the member for semiconductor manufacturing apparatus in an up-down direction, and into which a lift pin is inserted, or part of a gas hole that penetrates the member for semiconductor manufacturing apparatus in an up-down direction to supply gas to the wafer placement surface.

* * * * *